(12) United States Patent
Chong et al.

(10) Patent No.: US 9,166,596 B2
(45) Date of Patent: Oct. 20, 2015

(54) MEMORY INTERFACE CIRCUITRY WITH IMPROVED TIMING MARGINS

(71) Applicant: Altera Corporation, San Jose, CA (US)

(72) Inventors: Yan Chong, San Jose, CA (US); Warren Nordyke, Cupertino, CA (US); Sean Shau-Tu Lu, San Jose, CA (US); Ee Mei Ooi, Bayan Lepas (MY); Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/686,727

(22) Filed: Nov. 27, 2012

(65) Prior Publication Data

US 2014/0145756 A1    May 29, 2014

(51) Int. Cl.
| | |
|---|---|
| *G06F 7/38* | (2006.01) |
| *H03K 17/00* | (2006.01) |
| *G11C 7/00* | (2006.01) |
| *H03K 19/177* | (2006.01) |
| *G06F 13/16* | (2006.01) |
| *G11C 7/10* | (2006.01) |

(52) U.S. Cl.
CPC .............. *H03K 19/177* (2013.01); *G06F 13/16* (2013.01); *G11C 7/1066* (2013.01)

(58) Field of Classification Search
CPC ................ H03K 19/1776; H03K 19/17728; G05B 19/045; G05B 7/00; G11C 7/00
USPC .............. 326/40, 46; 365/193; 327/185, 365; 713/400, 401
See application file for complete search history.

(56) References Cited

U.S. PATENT DOCUMENTS

| | | | |
|---|---|---|---|
| 7,020,031 B2 | 3/2006 | Shin et al. | |
| 7,031,205 B2 | 4/2006 | Han et al. | |
| 7,079,441 B1 * | 7/2006 | Partsch et al. | 365/226 |
| 7,345,933 B1 * | 3/2008 | Telem et al. | 365/193 |
| 7,457,175 B1 * | 11/2008 | Griffith et al. | 365/193 |
| 7,543,172 B2 * | 6/2009 | Kizer et al. | 713/401 |
| 7,710,799 B2 | 5/2010 | Na et al. | |
| 8,351,282 B2 * | 1/2013 | Lee | 365/193 |
| 8,630,131 B1 * | 1/2014 | Shiao et al. | 365/189.07 |
| 2006/0168470 A1 | 7/2006 | Han et al. | |
| 2011/0016282 A1 * | 1/2011 | Gillingham et al. | 711/167 |
| 2011/0019489 A1 * | 1/2011 | Huang et al. | 365/193 |
| 2012/0170384 A1 | 7/2012 | Oh | |

OTHER PUBLICATIONS

Manohararajah et al., U.S. Appl. No. 13/149,562, filed May 31, 2011.
Shiao et al., U.S. Appl. No. 13/562,204, filed Jul. 30, 2012.

* cited by examiner

*Primary Examiner* — Dylan White
(74) *Attorney, Agent, or Firm* — Treyz Law Group; Jason Tsai

(57) ABSTRACT

Integrated circuits may include memory interface circuitry that communicates with memory. The memory interface circuitry may include latch circuitry that receives a data strobe enable signal from the memory controller and latches the data strobe enable signal using a data strobe signal received from the memory. The integrated circuit may include logic circuitry that gates the data strobe signal using the latched data strobe enable signal. The logic circuitry may pass the data strobe signal in response to activation of the latched data strobe enable signal. The integrated circuit may include counter circuitry that monitors the gated data strobe signal. The counter circuitry may monitor the gated data strobe signal by counting pulses in the gated data strobe signal to produce a counter value. When the counter value reaches a target value, the logic circuitry may block the data strobe signal from passing to the memory controller.

18 Claims, 11 Drawing Sheets

MEMORY INTERFACE CIRCUITRY WITH IMPROVED TIMING MARGINS

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices). When performing such memory read and write operations, the timing of control and data signals is critical.

Because programmable integrated circuits can be configured in many different ways and are installed on many different types of boards, the lengths of circuit board traces coupling the programmable integrated circuit to the memory devices can vary from one system to another. As a result, it is generally not possible to know in advance exactly how data, control, and clock paths between a programmable integrated circuit and a given memory device will perform. In some systems, the data and clock paths may have one set of timing characteristics, whereas in other systems the data and clock paths may have a different set of timing characteristics.

Mismatch (or skew) between the data and clock paths may result in degraded setup and hold times. In modern high speed memory interface circuitry that use double data rate (DDR) transfers (i.e., a data transmission scheme in which data toggles on both rising and falling edges of the clock), a small amount of skew will result in faulty data transfer during read/write operations. Moreover, variations in operating conditions (i.e., voltage and temperature variations) can further degrade setup and hold times.

SUMMARY

An integrated circuit may communicate with memory such as external memory or integrated memory. The integrated circuit may include a memory controller that receives and fulfills memory access requests. The memory controller may fulfill memory access requests by providing control signals memory interface circuitry that are used by the memory interface circuitry to communicate with the memory. The control signals may include a data strobe enable signal for gating data strobe signals received from the memory. The gated data strobe signals may be provided to the memory controller by the memory interface circuitry.

The integrated circuit may include latch circuitry that receives the data strobe enable signal from the memory controller and latches the data strobe enable signal based on a data strobe signal received from the memory. The integrated circuit may include logic circuitry that uses the data strobe signal and the latched data strobe enable signal to gate the data strobe signal. In response to activation of the latched data strobe enable signal (e.g., when activation of the data strobe enable signal propagates to the output of the latch circuitry), the logic circuitry may pass the data strobe signal to the memory controller as the gated data strobe signal.

The integrated circuit may include counter circuitry that monitors the gated data strobe signal. The counter circuitry may monitor the gated data strobe signal by counting pulses in the gated data strobe signal to produce a counter value. The counter value may be used to identify how many data transfers have occurred between the memory and the integrated circuit (e.g., how many memory read operations have occurred). When the counter value reaches a target value, the logic circuitry may block the data strobe signal from passing to the memory controller.

Further features of the present invention, its nature and various advantages will be more apparent from the accompanying drawings and the following detailed description.

DETAILED DESCRIPTION

Embodiments of the present invention relate to integrated circuits containing memory interface circuitry. The memory interface circuitry may be used to interface with memory (e.g., external memory) such as random-access memory (RAM). The integrated circuits may be digital signal processors, microprocessors, application specific integrated circuits, or other suitable integrated circuits. These types of integrated circuits that are operable to communicate with system memory can benefit from improved timing capabilities of the memory interface circuitry.

Figure 1:
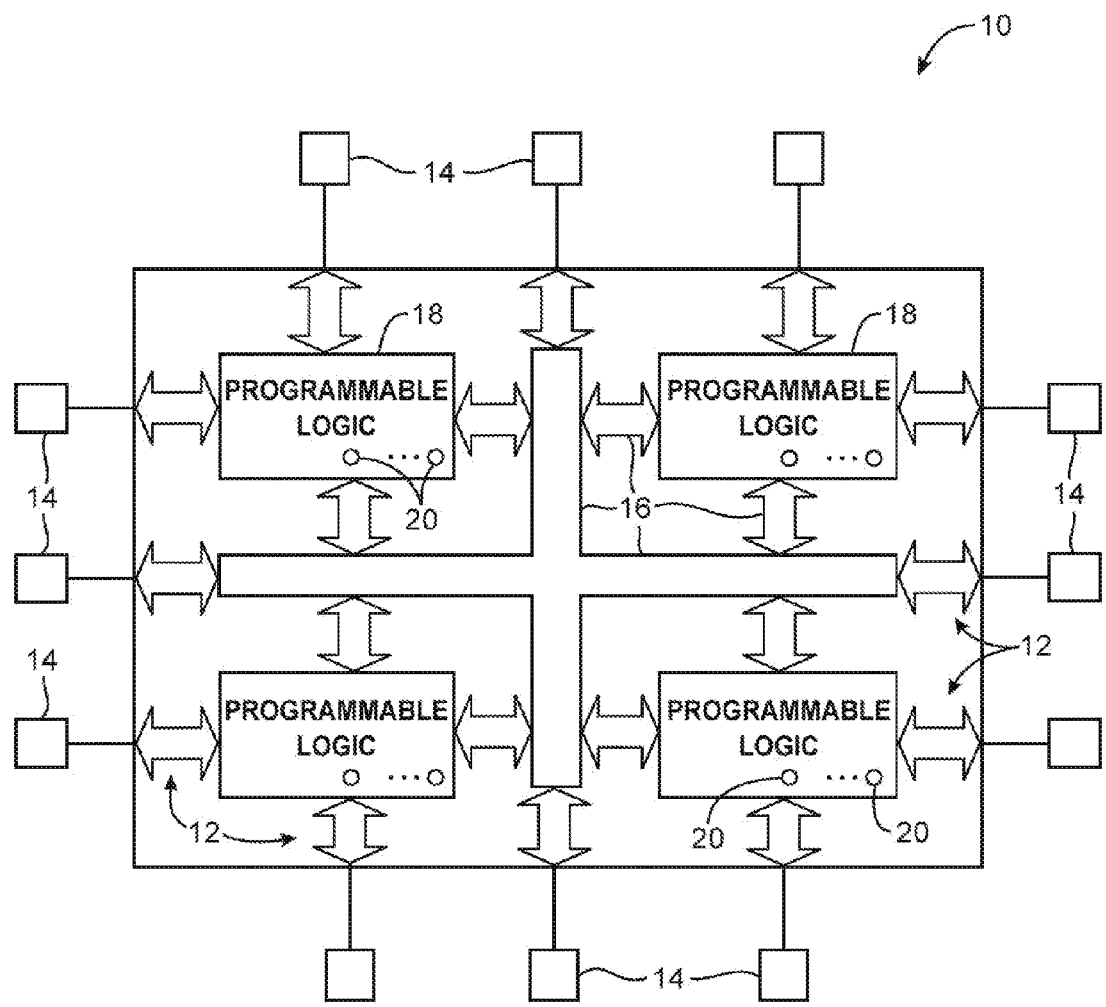
FIG. 1 is a diagram of an illustrative programmable integrated circuit in accordance with an embodiment of the present invention.

As an example, an integrated circuit such as a programmable integrated circuit may include memory interface circuitry. This is merely illustrative and does not serve to limit the scope of the present invention. If desired, application specific integrated circuits, microprocessors, and other application specific standard products may contain memory interface circuitry. FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are often applied to gates of metal-oxide-semiconductor (MOS) transistors (sometimes referred to as pass gate transistors). This example is merely illustrative. If desired, programmable elements 20 may be used to provide static output signals for configuring any desired circuitry on device 10.

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
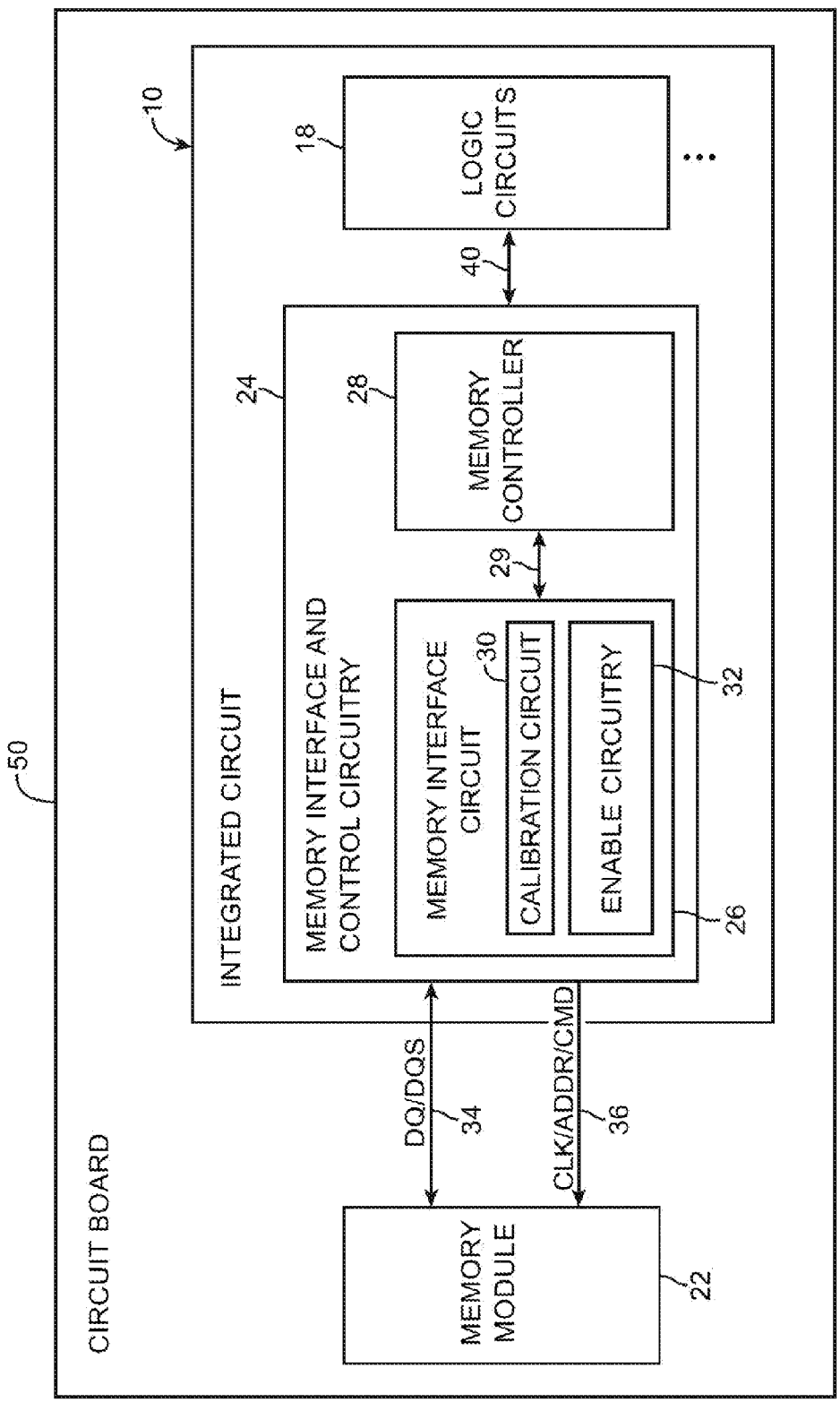
FIG. 2 is a diagram of an illustrative integrated circuit operable to communicate with an external memory module in accordance with an embodiment of the present invention.

Device 10 may communicate with memory such as memory module 22 (see, e.g., FIG. 2). Memory module 22 may be a memory device sometimes referred to as a single in-line memory module (SIMM) or a dual in-line memory module (DIMM). Device 10 may be configured to communicate with at least two memory modules 22, at least four memory modules 22, etc. As shown in FIG. 2, integrated circuit 10, memory module 22, and other circuit components (e.g., integrated circuit chips, surface mount components, etc.) may be mounted on a circuit board 50. Circuit board 50 may, for example, be a rigid printed circuit board (PCB) or other suitable types of printed circuit substrates. Board components may be interconnected through conductive traces and packaging (e.g., sockets into which integrated circuits are mounted) formed on board 50. The example of FIG. 2 in which integrated circuit 10 and memory module 22 are formed as separate components on circuit board 50 is merely illustrative. If desired, integrated circuit 10 and memory module 22 may be formed together as a single component or a single package that may be mounted on circuit board 50. For example, integrated circuit 10 and memory module 22 may be formed as respective integrated circuit die that are stacked to form a single integrated circuit, which may be sometimes referred to as a 3D integrated circuit. In this scenario, paths such as paths 34 and 36 between the integrated circuit die may be formed from through-silicon vias that interconnect integrated circuit 10 and memory module 22 (e.g., vias through a silicon substrate of integrated circuit 10 or memory module 22). As another example, integrated circuit 10 and memory module 22 may each be coupled to an interposer (e.g., to a top surface of the interposer). In this scenario, the interposer may include a substrate and traces on the substrate may form paths 34 and 36 between integrated circuit 10 and memory module 22. The interposer may be mounted to circuit board 50 Arrangements in which two or more integrated circuit die are coupled to an interposer may be sometimes be referred to as 2.5D integrated circuits.

Device 10 may include memory interface circuitry (sometimes referred to as memory interface and control circuitry) that serves to relay information between memory module 22 and logic circuits 18 that are internal to device 10. Memory interface circuitry 24 may include memory interface circuit 26 and memory controller 28. Read/write data may be conveyed between memory interface circuitry 24 and programmable circuitry 18 via path 40. Memory controller 28 may be configured to generate appropriate control signals corresponding to the memory protocol currently under use (e.g., circuit 28 may handle memory data management to address desired banks, rows, and columns and to perform memory refresh).

Memory interface circuit 26 may include memory interface calibration circuitry 30, enable circuitry 32, and other circuitry operable to perform desired data rate conversions and operable to generate signals that meet timing requirements specified by the memory protocol currently under use.

Memory interface circuit 26 may be coupled to memory module 22 through paths 34 and 36. During memory read operations, data (DQ) signals and data strobe (DQS) signals may be conveyed from memory module 22 to memory interface circuit 26 over path 34. During memory write operations, DQ/DQS may be conveyed from memory interface circuit 26 to memory module 22 over path 34. Calibration circuitry 30 may be used upon startup to perform calibration operations (e.g., for reducing skew caused by process variations).

During read and write operations, control signals such as clock CLK, address ADDR, and command CMD signals may be conveyed from memory interface circuitry 24 to memory module 22 over path 36. The timing of the control signals may be controlled by memory interface circuit 26. Memory controller 28 may provide the control signals to memory interface circuit 26 via path 29. Memory interface circuit 26 may process the control signals to provide control signals with appropriate timing characteristics to memory module 22.

Signal CLK may serve as a system reference clock (e.g., a reference clock to which the DQS signals, address signal ADDR, and command signal CMD should be aligned). Signal CMD may be configured to a first value to initiate a read operation, to a second value to initiate a write operation, to a third value during normal operation, and to other values to initiate any desired operations. Signal ADDR specifies the address (e.g., a selected bank address in a memory device) from which data is read out during read operations and the address to which data is written during write operations.

The arrangement of FIG. 2 is merely illustrative and is not intended to limit the scope of the present invention. Integrated circuits other than programmable integrated circuits may similarly include memory interface circuitry 24 that is used to communicate with one or more memory modules 22.

Figure 3:
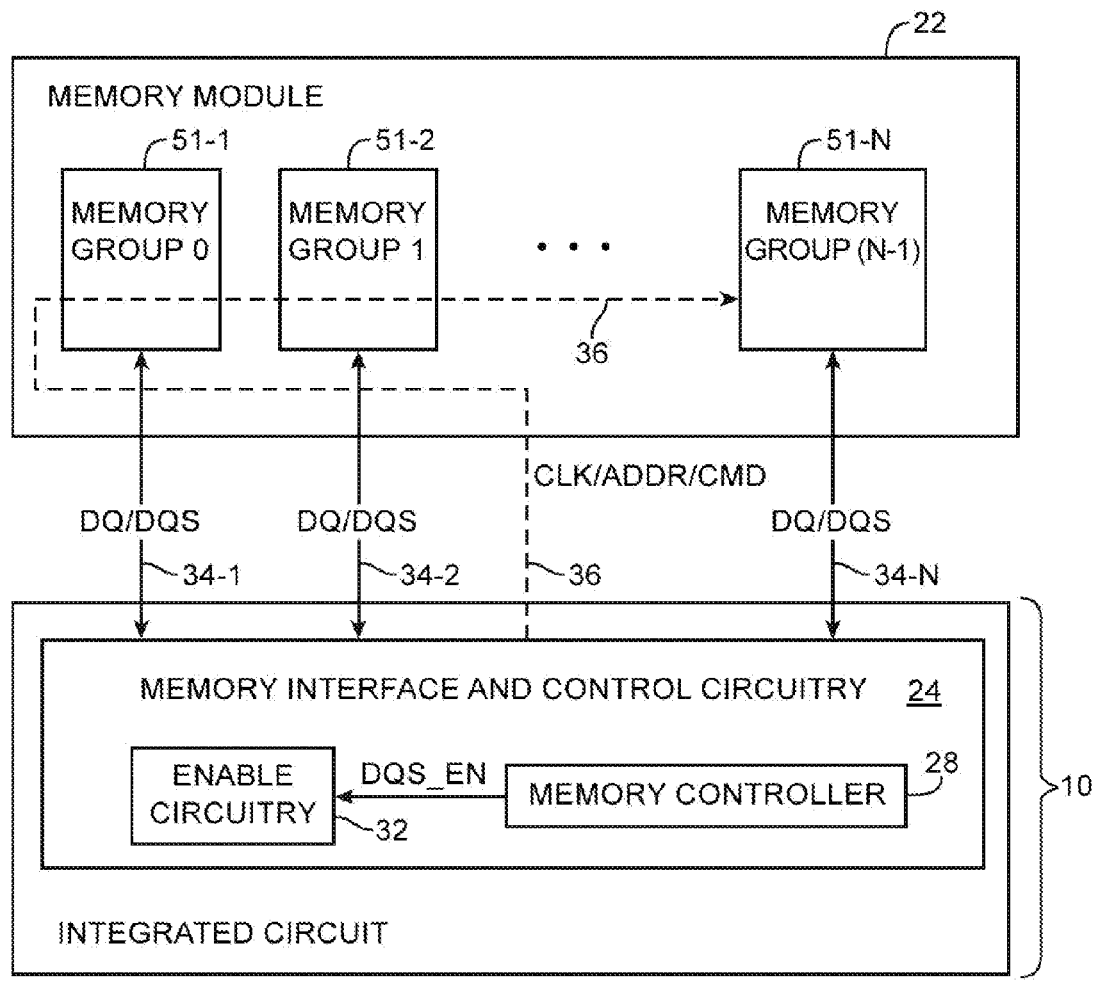
FIG. 3 is a diagram of an illustrative memory module that contains multiple memory groups in accordance with an embodiment of the present invention.

Memory module 22 may include a series of memory devices, each of which is sometimes referred to as a memory group (as shown in FIG. 3). For example, memory module 22 may include first memory group 51-1, second memory group 51-2, ..., and $N^{th}$ memory group 51-N. Memory module 22 may include nine memory groups (as an example). Each of the memory groups may contain hundreds or thousands of memory cells (e.g., RAM cells). The memory groups may communicate with memory interface circuitry 24 through respective signal paths. For example, first memory group 51-1 may communicate with circuitry 24 by sending data and data strobe signals (i.e., DQ and DQS) over path 34-1, second memory group 51-2 may communicate circuitry 24 by sending DQ/DQS over path 34-2, etc.

In general, memory access operations are not synchronized with system-level control signals CLK/CMD/ADDR. As a result, the DQ signals that are received from memory module 22 are not phase aligned with any known clock signal in device 10. It is therefore necessary to provide DQS clock signals with the DQ signals, so that the DQS clocks can be used to establish proper timing relationships when processing the DQ signals. For example, during a read operation, memory interface circuitry 24 uses the DQS clocks in capturing data as it is transmitted over paths 34 from memory 22. Process, voltage, and temperature (PVT) variations may introduce skew between the DQ and DQS signals, resulting in degraded data sampling margins (i.e., reduced setup and hold times).

The operation of each memory group is somewhat independent, so memory module 22 generates a separate DQS signal for each of the memory groups. Memory interface circuitry 24 may send control signals to the memory groups via path 36. Memory module 22 of FIG. 3 may be a type of memory module in which the control signals on path 36 arrive at each of the memory groups at different times. For example, because of the way path 36 is routed, the control signals on path 36 may arrive first at memory group 51-1 and then arrive at each subsequent memory group after some delay.

During read operations, appropriate control signals may be sent over path 36 to direct the memory groups to output read data. Read data may be generated from the memory groups at different times depending on when control signals CLK/CMD/ADDR arrive at a particular memory group. For example, memory group 51-1 may output read data before subsequent memory group 51-2, memory group 51-2 may output read data before subsequent memory group 51-3, memory group 51-3 may output read data before subsequent memory group 51-4, etc. Memory interface circuitry 24 may therefore receive read data from the different memory groups at staggered times.

During read data transfers, DQS signals from memory module 22 may be active and valid. However, when no data is being provided by memory module 22, the DQS signals may be invalid. To help prevent use of invalid DQS signals, memory interface circuit 24 may gate DQS signals received from memory module 22. Memory controller 28 may provide a data strobe enable signal DQS_EN to enable circuitry 32 (FIG. 2) that is used provide a window of time in which valid DQS signals are passed to memory controller 28. Outside of the window, invalid DQS signals may be blocked from reaching memory controller 28.

It may be challenging to ensure that data strobe enable signals from memory controller 28 align with data strobe signals received from memory module 22. For example, memory protocols such as DDR3 and DDR4 may require that data strobe enable signals are asserted during preamble time frames. However, as the preamble time frames are reduced to improve memory performance, it becomes difficult to ensure that the data strobe enable signals from the memory controller are activated during the reduced preamble time frames. Memory interface circuitry 26 may include enable circuitry 32 (e.g., gating circuitry) that helps to ensure alignment of data strobe enable signals to data strobe signals. The enable circuitry may sometimes be referred to as data strobe enable circuitry, because the enable circuitry is used to gate the data strobe signals based on the data strobe enable signals.

Figure 4:
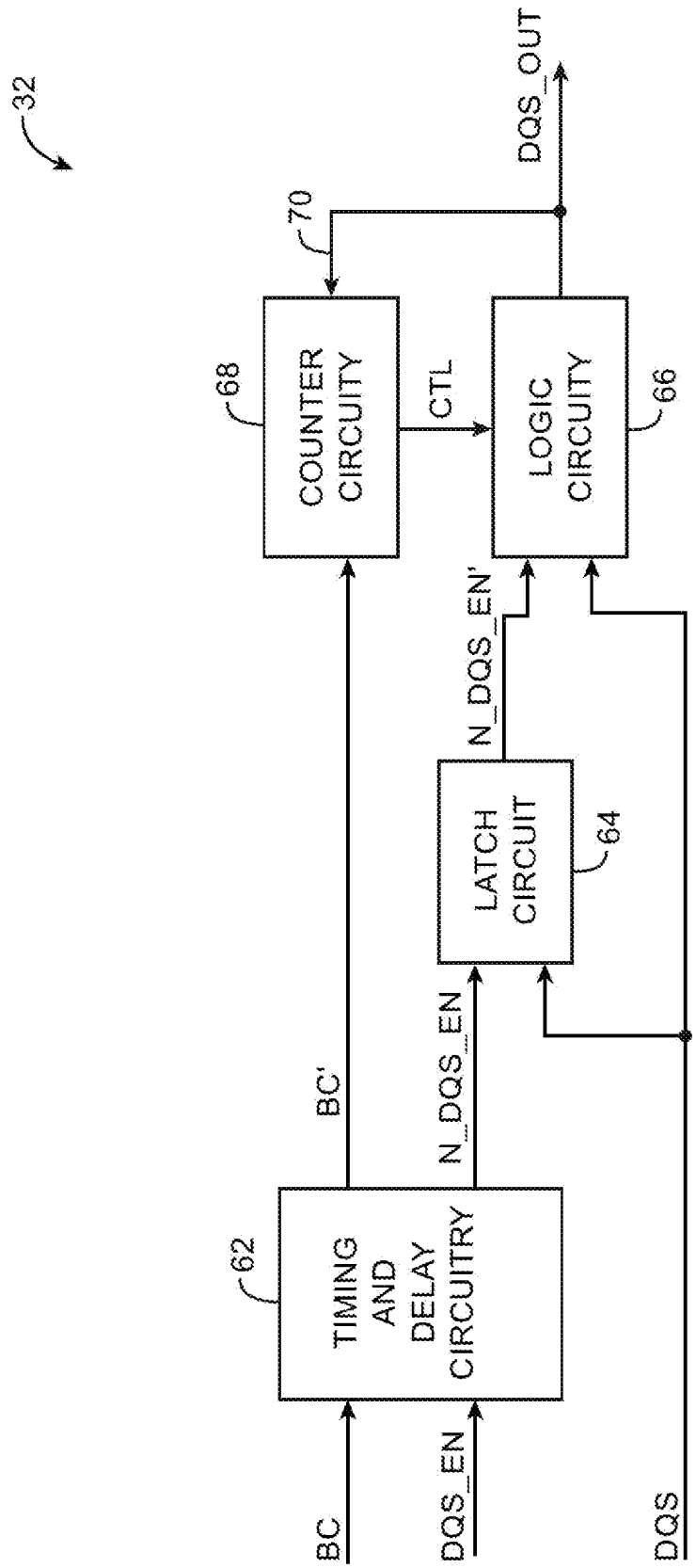
FIG. 4 is a diagram of illustrative enable circuitry that may be used to gate a data strobe signal in accordance with an embodiment of the present invention.

FIG. 4 is a diagram of illustrative enable circuitry 32 that may be used to gate data strobe (DQS) signals received from memory module 22. The DQS signals may be gated based on an enable signal DQS_EN received from memory controller 28. Enable circuitry 32 may include timing and delay circuitry 62, latch circuit 64, logic circuitry 66, and counter circuitry 68.

The DQS_EN signal may be received by timing and delay circuitry 62, which produces an adjusted and delayed data strobe enable signal N_DQS_EN. Timing and delay circuitry 62 may serve to adjust the timing of the DQS_EN signal relative to the DQS signal to produce N_DQS_EN. For example, timing and delay circuitry 62 may adjust the timing of the DQS_EN signal by a memory clock cycle, one and a half memory clock cycles, or any desired amount of time. Timing and delay circuitry 62 may be configured during calibration (e.g., using calibration circuitry 30 of FIG. 2) to provide an appropriate timing adjustment for a given integrated circuit 10 and memory module 22 (e.g., because each integrated circuit 10 and memory module 22 may have different timing characteristics).

The adjusted data strobe enable signal N_DQS_EN and the DQS signal received from memory module 22 may be received at inputs of latch circuit 64. Latch circuit 64 may produce an output N_DQS_EN' by latching the N_DQS_EN signal using the DQS signal so that the N_DQS_EN' signal is asserted at a desired time (e.g., within a preamble time frame of the DQS signal). As an example, the N_DQS_EN signal received from timing and delay circuitry 62 may be propagated to the output of latch circuit 64 as N_DQS_EN' in response to a de-asserted DQS signal.

Logic circuitry 66 may receive the DQS signal and the N_DQS_EN' signal produced by latch circuit 64. Logic circuitry 66 may enable propagation of the DQS signal to the output of enable circuitry 32 as the DQS_OUT signal based on the N_DQS_EN' signal. For example, the value of DQS_OUT may have the same value as DQS after the N_DQS_EN' signal is activated. The DQS_OUT signal may be used by memory interface circuit 26 to sample a corresponding DQ (data) signal from memory module 22.

Counter circuitry 68 may receive the DQS_OUT signal and monitor the DQS_OUT signal to produce control signal CTL for logic circuitry 66. Counter circuitry 68 may monitor the DQS_OUT signal by counting how many times DQS_OUT is asserted. The counted value may be used to determine when a DQS to DQS_OUT path should be disabled. As an example, the DDR4 memory standard may be configured for 8 read data transfers during a burst read operation. Each read data transfer may occur at a transition (rising edge or falling edge) of the DQS_OUT signal. In this scenario, each time the counted value is incremented may indicate that two read data transfers have occurred, and counter circuitry 68 may control logic circuitry 66 via control signal CTL to disable propagation of DQS to DQS_OUT when the counted value reaches four (e.g., because all eight of the read data transfers for the burst read operation are complete).

The DQS_EN signal received by enable circuitry 32 may be used to control initial enabling of DQS to DQS_OUT propagation through logic circuitry 66 (e.g., the start of a valid DQS window), whereas counter circuitry 68 may be used to control final disabling of the DQS to DQS_OUT propagation (e.g., the end of a valid DQS window). Timing and delay circuitry 62, latch circuit 64, logic circuitry 66, and counter circuitry 68 may help to provide improved timing margins for DQS enabling using a data strobe enable (DQS_EN) signal provided by memory controller 28.

In some scenarios, it may be desirable to accommodate on-the-fly adjustment of read burst operations. For example, memory controller 28 may provide a burst chop (BC) signal that is received by enable circuitry 32. Timing and delay circuitry 62 may receive and adjust the timing of the BC signal to produce a BC' signal. The timing of the BC signal may, for example, be adjusted similarly to the DQS_EN signal. The adjusted burst chop signal BC' may be received by counter circuitry 68 and may configure counter circuitry 68 for a shorter read burst length (e.g., to disable the DQS_OUT signal early).

Figure 5:
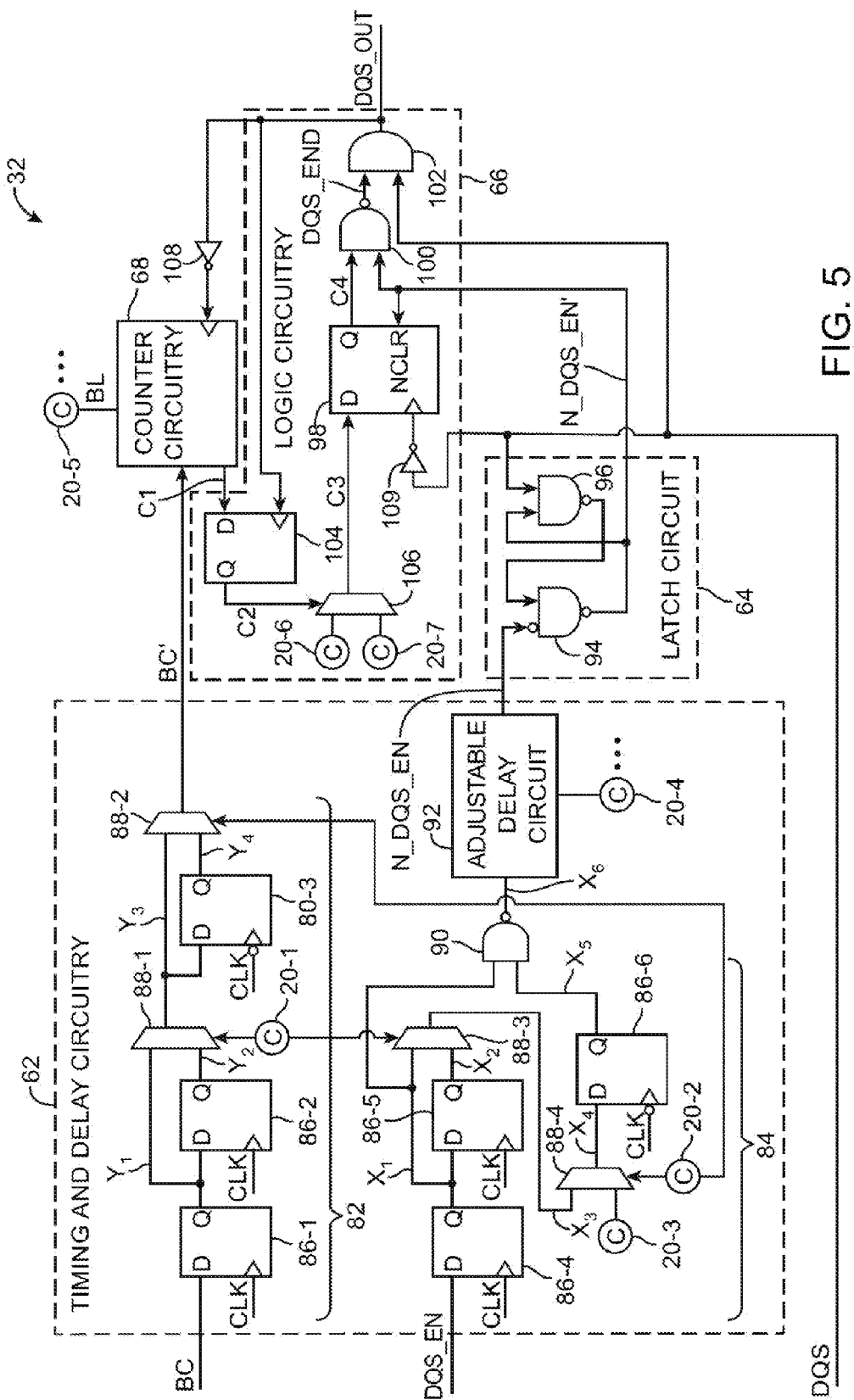
FIG. 5 is a diagram of illustrative enable circuitry having latch circuitry and counter circuitry for gating a data strobe signal in accordance with an embodiment of the present invention.

FIG. 5 is an illustrative diagram of enable circuitry 32 that may be used to gate a DQS signal using a DQS_EN signal. As shown in FIG. 5, enable circuitry 32 may include timing and delay circuitry 62, latch circuit 64, logic circuitry 66, and counter circuitry 68.

Timing and delay circuitry 62 may include delay paths 82 and 84. Delay path 82 may serve as an adjustable delay path for burst chop signal BC, whereas delay path 84 may serve as an adjustable delay path for data strobe enable signal DQS_EN. The amount of delay provided by each delay path may be substantially similar to help prevent any added skew between burst chop signal BC and data strobe enable signal DQS_EN.

Delay path 82 may include flip-flops 86-1, 86-2, and 86-3. Flip-flop 86-1 may be clocked by memory clock signal CLK. Flip-flop 86-1 may synchronize the burst chop signal to memory clock CLK to produce intermediate signal Y1.

Flip-flops 86-2 and 86-3 may be selectively switched into use via multiplexers 88-1 and 88-2 to provide increased or reduced delay for the BC signal. Flip-flop 86-2 may be clocked by memory clock signal CLK and may contribute a full clock cycle delay (e.g., intermediate signal Y1 may be delayed by one full clock cycle to produce intermediate signal Y2). Flip-flop 86-3 may be clocked by an inverted version of memory clock signal CLK and may contribute a half clock cycle delay, because the inverted memory clock signal is delayed by a half clock cycle relative to memory clock signal CLK. In other words, output signal Y3 of multiplexer 88-1 (e.g., a selected one of Y1 or Y2) may be delayed by a half clock cycle of memory clock signal CLK to produce intermediate signal Y4.

Multiplexers 88-1 and 88-2 may be controlled via respective programmable elements 20-1 and 20-2 to control how much delay is provided by delay path 82. As an example, programmable element 20-1 may be loaded with an appropriate control value that directs multiplexer 88-1 to pass the output of flip-flop 86-2 (signal Y2) to multiplexer 88-2, whereas programmable element 20-2 may be loaded with a control value that directs multiplexer 88-2 to pass the output of flip-flop 86-3 (signal Y4) as delayed burst chop signal BC'. In this scenario, flip-flops 86-2 and 86-3 may be switched into use and output burst chop signal BC' may be synchronized to memory clock CLK and further delayed by one and a half clock cycles relative to input signal BC.

Delay path 84 for data strobe enable signal DQS_EN may include flip-flops 86-4, 86-5, and 86-6. Flip-flop 86-4 may produce intermediate signal X1 that is synchronized to memory clock CLK. Flip-flops 86-5 and 86-6 may be switched into use via multiplexers 88-3 and 88-4 similarly to flip-flops 86-2 and 86-3 of delay path 82. For example, multiplexer 88-3 may be configured via programmable element 20-1 to provide signal X3 selected from signal X1 or signal X2 having an additional clock cycle of delay. As another example, multiplexer 88-4 may be configured via programmable element 20-2 to provide signal X4 selected from signal X3 and the static control signal from programmable element 20-3.

Multiplexers 88-3 and 88-4 of delay path 84 may share programmable elements 20-1 and 20-2 with multiplexers 88-1 and 88-2 of delay path 82 so that the relative delay between burst chop signal BC and data strobe enable signal DQS_EN is maintained by timing and delay circuitry 62 (e.g., control values loaded into programmable elements 20-1 and 20-2 may also be used to configure delay paths 82 and 84). This example is merely illustrative. Multiplexers 88-3 and 88-4 may, if desired, be controlled by different programmable elements from multiplexers 88-1 and 88-2.

Logic not-AND (NAND) gate 90 may receive signals X1 and X5 at inputs and produce signal X6 by performing a logic NAND function on signals X1 and X5. In other words, signal X6 may be logic zero only when signals X1 and X5 are both logic one. Adjustable delay circuit 92 may receive signal X6 from NAND gate 90 and delay signal X6 to produce the N_DQS_EN signal. One or more programmable elements 20-4 may be configured to provide static control signals to control the amount of delay provided by adjustable delay circuit 92. Delay circuit 92 may include any desired adjustable delay circuitry such as a configurable delay chain (e.g., an inverter-based delay chain that can be controlled via programmable elements 20-4 to provide a desired amount of delay).

Latch circuit 64 may include cross-coupled NAND gates 94 and 96. The example of FIG. 5 in which latch circuit 64 includes cross-coupled NAND gates 94 is merely illustrative. If desired, latch circuit 64 may be formed from any desired logic gates such as inverters, NOR gates, OR gates, AND gates, etc.

NAND gate 94 may receive an inverted version of N_DQS_EN from timing and delay circuitry 62 in parallel with the output of NAND gate 96 and produce the N_DQS_EN' signal. NAND gate 96 may receive the output of NAND gate 94 (i.e., the N_DQS_EN' signal) in parallel with the DQS signal (e.g., from memory module 22 of FIG. 2).

Latch circuit 64 may latch the N_DQS_EN signal using the DQS signal received from memory to help ensure that the N_DQS_EN' signal is activated at a desired time within a DQS preamble time frame. In the example of FIG. 5, latch circuit 64 may assert the N_DQS_EN' signal when the N_DQS_EN signal is logic one. When the N_DQS_EN signal is logic zero, latch circuit 64 may de-assert the N_DQS_EN' signal only in response to a DQS signal having a logic zero value.

The N_DQS_EN' signal produced by latch circuit 64 may be provided to logic circuitry 66. Logic circuitry 66 may include flip flop 98, NAND gate 100, AND gate 102, flip flop 104, and multiplexer 106. AND gate 102 may receive the DQS signal from memory module 22 and enable signal DQS_ENO from NAND gate 100. When DQS_ENO is asserted (logic one), the DQS signal is passed by AND gate 102 as the DQS_OUT signal. When the DQS_ENO signal is de-asserted, the DQS signal is blocked and DQS_OUT is de-asserted by AND gate 102. It is generally desirable to control the assertion and de-assertion of the DQS_ENO signal so that the DQS signal is passed as DQS_OUT only during a window of valid data transfer from memory module 22 to integrated circuit 10 (e.g., to avoid using invalid DQS signals).

Latch circuit 64 may serve to control the timing of the assertion of DQS_ENO, whereas counter 68 may be used to control the timing of the de-assertion of DQS_ENO. When the N_DQS_EN' signal (i.e., the latched data strobe enable signal) is de-asserted (logic zero) by latch circuit 64, NAND gate 100 asserts DQS_ENO, which allows DQS to pass through AND gate 102 as DQS_OUT. The N_DQS_EN' signal may be provided to negative clear input NCLR of flip-flop 98 to ensure that N_DQS_EN' controls the assertion of the DQS_ENO signal (e.g., because flip-flop output signal C4 may be held at logic zero until N_DQS_EN' is asserted).

Counter circuitry 68 may monitor the DQS_OUT signal. In the example of FIG. 5, counter circuitry 68 may receive an inverted version of DQS_OUT via inverter 108 at a clock input. Counter circuitry 68 may count incrementally at the rising edge of the inverted DQS_OUT signal (i.e., at the falling edge of the DQS_OUT signal). The current count may be used to identify how many valid data transfers have occurred in the current memory operation. For example, a count of four may indicate that eight double data rate read data transfers have occurred during a burst read operation.

Counter circuitry 68 may use the current count to produce output signal C1. Output signal C1 may be asserted when the current count reaches a target value. The target value may be configured via programmable elements 20-5. For example, the target value may be set to four via programmable elements 20-5 so that C1 is asserted after eight read data transfers (e.g., after the DQS_OUT signal has been asserted four times).

Signal C1 may be passed through flip-flop 104. Flip-flop 104 may be clocked using the DQS_OUT signal (e.g., flip-flop 104 may receive the DQS_OUT signal at a clock input). Flip-flop 104 may synchronize C1 to DQS_OUT to produce signal C2. Flip-flop 104 may provide signal C2 to a control input of multiplexer 106. Multiplexer 106 may provide signal C3 selected from programmable elements 20-6 and 20-7 based on the C2 signal to the D input of flip-flop 98. As an example, programmable element 20-6 may be loaded with a logic zero value, whereas programmable element 20-7 may be loaded with a logic one value. In this scenario, multiplexer 106 may select the logic zero signal of programmable element 20-6 when C2 is logic zero and select the logic one signal of programmable element 20-7 when C2 is logic one (i.e., C3 may follow C2).

Inverter 109 may provide an inverted DQS signal to a clock input of flip-flop 98. Flip-flop 98 may receive signal C3 from multiplexer 106 at input D. Flip-flop 98 synchronize signal C3 to the inverted DQS signal to produce signal C4 (e.g., when the N_DQS_EN' signal from latch circuit 64 is asserted and allows signal C3 to pass to the Q output of flip-flop 98 as signal C4). Signal C4 may control the timing of the de-assertion of the DQS_ENO signal (e.g., the end of a valid DQS window). For example, when the DQS signal is logic one, signal C3 is passed through flip-flop 98 as signal C4. In this scenario, DQS_ENO may be de-asserted by NAND gate 100 when C4 is asserted (e.g., DQS_ENO may be controlled by counter circuitry 68 after latched data strobe enable signal N_DQS_EN' is asserted).

Counter circuitry 68 may receive adjusted burst chop signal BC' from timing and delay circuitry 62. Burst chop signal BC' may be used for on-the-fly adjustment of read burst length. Consider the scenario in which counter circuitry 68 is configured via programmable elements 20-5 for read burst length of eight (e.g., programmable elements 20-5 may be loaded with appropriate values that direct counter circuitry 68 to count four valid read data transfers before asserting signal C1). In this scenario, burst chop signal BC' may be asserted during read operations in which it is desired to adjust the burst length. In response to receiving an asserted burst chop signal BC', counter circuitry 68 may adjust the target counter value to any desired value. Adjusted target values may include values that are less than the original target value such as two or, if desired, values that are greater than the original target value (e.g., values greater than four).

The example of FIGS. 4 and 5 in which the burst chop signal may be used for on-the-fly adjustment of read burst length is merely illustrative. If desired, the burst chop signal and associated circuitry such as delay path 82 of FIG. 5 may be omitted (e.g., when on-the-fly adjustment of read burst length is not desired).

Figure 6:
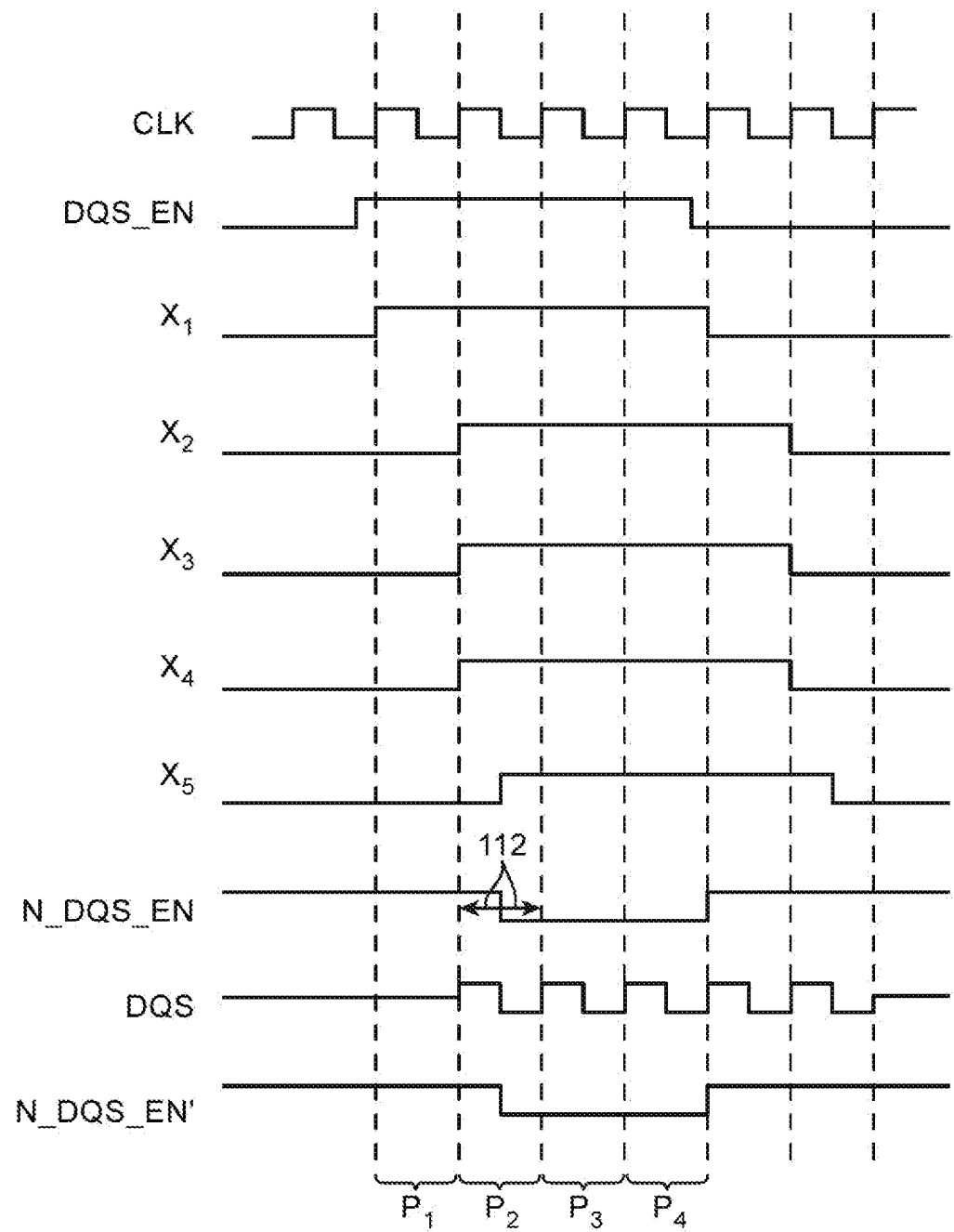
FIG. 6 is an illustrative timing diagram showing how latch circuitry may be used to control activation timing of a gated data strobe enable signal in accordance with an embodiment of the present invention.

An illustrative timing diagram showing how latch circuitry 64 may be configured to latch a data strobe enable signal received from memory module 22 is shown in FIG. 6. In the example of FIG. 6, memory module 22 may be configured by memory controller 28 for a burst read operation of burst length 8. Programmable elements 20-1 and 20-2 may have been loaded with appropriate values that direct multiplexer 88-3 to pass signal X2 and multiplexer 88-4 to pass signal X3.

As shown in FIG. 6, the DQS_EN signal provided by memory controller 28 is synchronized to memory clock CLK by flip-flop 86-4 to produce intermediate signal X1. The DQS_EN and X1 signals may span four memory clock cycles (e.g., X1 may span clock cycles P1, P2, P3, and P4). Flip-flop 86-5 may delay signal X1 by one memory clock cycle to produce signal X2. Signal X2 may be passed by multiplexer 88-3 as signal X3 to multiplexer 88-4. Multiplexer 88-4 may pass signal X3 to flip-flop 86-6 as signal X4. Flip-flop 86-6 may delay signal X4 by half of a memory clock cycle to produce signal X5 (e.g., because flip-flop 86-6 is clocked by an inverted version of memory clock signal CLK).

NAND gate 90 may generate the N_DQS_EN signal as the inverse of the overlap between the X1 and X5 signals, which effectively shortens the window for which N_DQS_EN is activated (e.g., logic zero). Adjustable delay circuit 92 may be calibrated to help match the falling edge of the N_DQS_EN signal to the DQS preamble that occurs during memory clock cycle P2. In other words, the DQS_EN signal having an active window of four memory clock cycles may be shortened by one and a half clock cycles, inverted, and delayed to produce an active low N_DQS_EN signal that is activated (i.e., de-asserted) within the DQS preamble.

In the example of FIG. 6, device 10 may communicate with a memory module 22 that uses the DDR4 standard in which the DQS preamble may consist of a memory clock period in which the DQS signal is asserted for the first half of a clock period and subsequently de-asserted for the second half of the clock period. Prior to the DQS preamble, the DQS signal may be invalid. It may be desirable to adjust the timing of the N_DQS_EN signal to coincide with the falling edge of the DQS signal during the DQS preamble. However, due to operational variations, the N_DQS_EN signal can be delayed or advanced as shown by arrows 112.

As an example, the N_DQS_EN signal may be delayed or advanced based on variations of the DQS_EN signal or variations of timing and delay circuitry 62 that produces the N_DQS_EN signal (and intermediate signals such as X1, X2, etc.). If the N_DQS_EN signal is excessively delayed, valid data transfers could be missed. If the N_DQS_EN signal is excessively advanced, invalid data could be captured (e.g., data on a corresponding DQ line could be captured if the N_DQS_EN signal is active during the first half of the DQS preamble).

Latch circuit 64 may latch the N_DQS_EN signal only when the DQS signal is logic zero to help ensure that only valid portions of the DQS signal are used (e.g., so that the logic one value of DQS during the DQS preamble is not used to capture invalid data on DQ paths).

Figure 7:
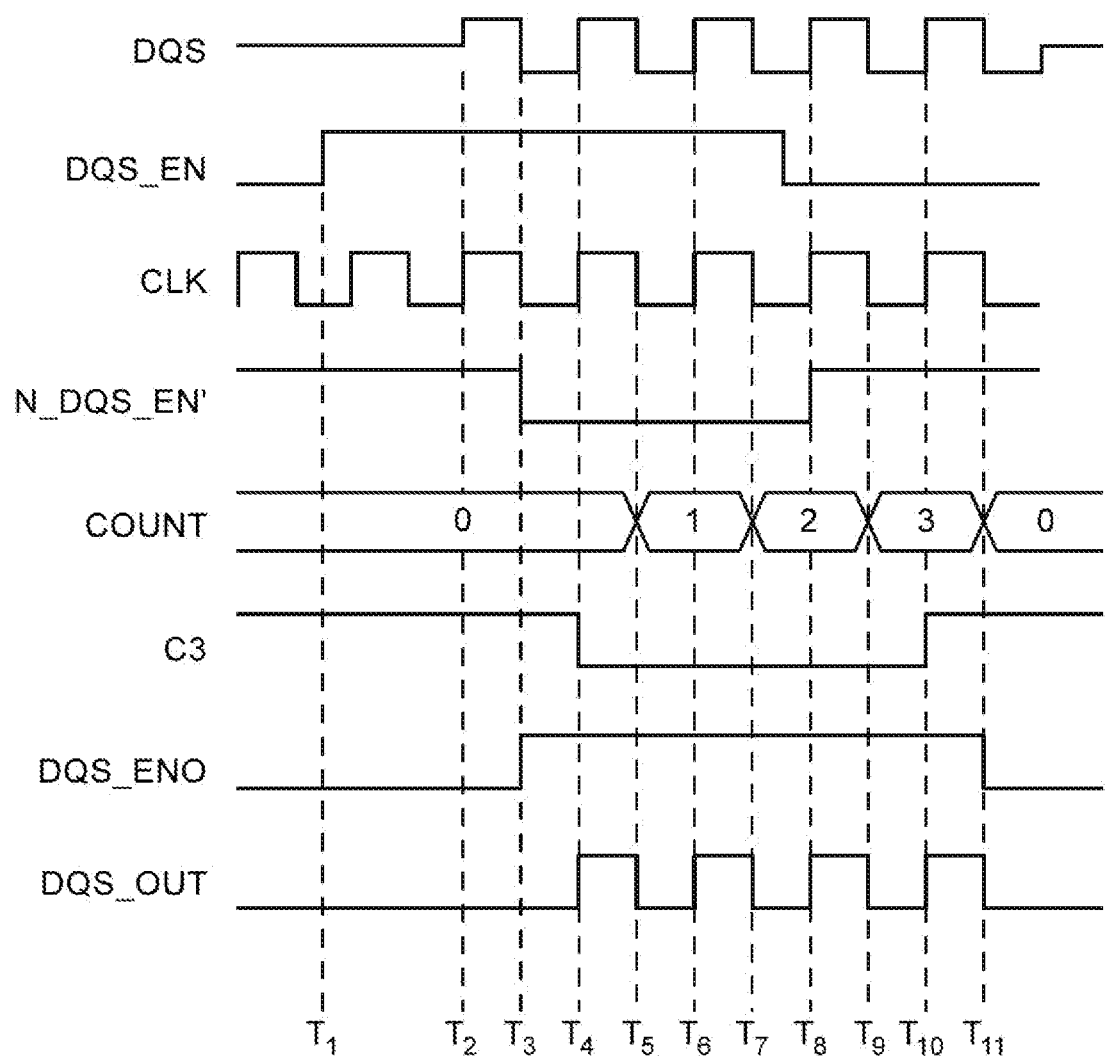
FIG. 7 is an illustrative timing diagram showing how memory interface circuitry having enable circuitry may be used to gate a data strobe signal using a data strobe enable signal received from a memory controller in accordance with an embodiment of the present invention.

FIG. 7 is an illustrative timing diagram showing how enable circuitry 32 may isolate a valid DQS window from a DQS signal provided by memory module 22 and a DQS_EN signal provided by memory controller 28. In the example of FIG. 7, memory module 22 may be configured to perform a burst read operation having burst length eight and may use a memory standard such as DDR4 in which the DQS preamble includes a half-cycle logic one followed by a half-cycle logic zero.

As shown in FIG. 7, the DQS_EN signal may be asserted by memory controller 28 at time T1, whereas the DQS signal may enter DQS preamble at time T2. Timing and delay circuitry 62 may shrink the enable window by one and a half clock cycles and synchronize the DQS_EN signal to memory clock CLK and the DQS preamble to produce the N_DQS_EN' signal (e.g., as shown in FIG. 6). In other words, circuitry 62 may shrink, invert, and adjust the timing of the DQS_EN signal to produce an active low N_DQS_EN' signal that is de-asserted at time T3 and re-asserted at time T8 (e.g., the N_DQS_EN' signal may be active between times T3 and T8).

The activation of the N_DQS_EN' signal at time T3 triggers the assertion of the DQS_ENO signal by NAND gate 100 (e.g., because NAND gate 100 outputs a logic one whenever any of its inputs are logic zero). The assertion of the DQS_ENO signal controls AND gate 102 to pass DQS as DQS_OUT beginning from time T3.

Counter circuitry 68 may maintain a counter value COUNT that is initialized to zero. At time T4, DQS_OUT is asserted (because DQS is asserted). At time T5, DQS_OUT is de-asserted, which triggers counter circuitry 68 to increment counter value COUNT from zero to one, because counter circuitry 68 is clocked by the negative edge of DQS_OUT (which is the positive edge of the inverted DQS_OUT signal provided by inverter 108).

At every subsequent negative edge of the DQS_OUT signal until COUNT reaches a target counter value, counter circuitry 68 may increment COUNT (e.g., at times T7 and T9). In the example of FIG. 7, the target counter value may be three.

At time T8, the N_DQS_EN' signal may be asserted, which allows counter circuitry 68 to control DQS_ENO, because NAND gate 100 passes an inverted version of signal C4 and signal C4 is controlled by counter circuitry 68 when N_DQS_EN' is asserted. At the negative edge of DQS_OUT at time T11, the counter value has reached the target counter value of three (binary value 011) and C3 has been asserted (e.g., asserted by counter circuitry 68 via flip-flop 104 and multiplexer 106). Signal C3 may be propagated by flip-flop 98 as C4 to NAND gate 100, which de-asserts the DQS_ENO signal in response to receiving the asserted C3 signal.

By controlling de-assertion of the DQS_ENO signal using counter circuitry 68, timing margins for the DQS_EN signal from memory controller 28 may be improved. For example, the falling edge of DQS_EN can be advanced or delayed as long as the corresponding rising edge of N_DQS_EN' occurs between the first falling edge of DQS and the final falling edge of DQS (e.g., between T3 and T11).

Figure 8:
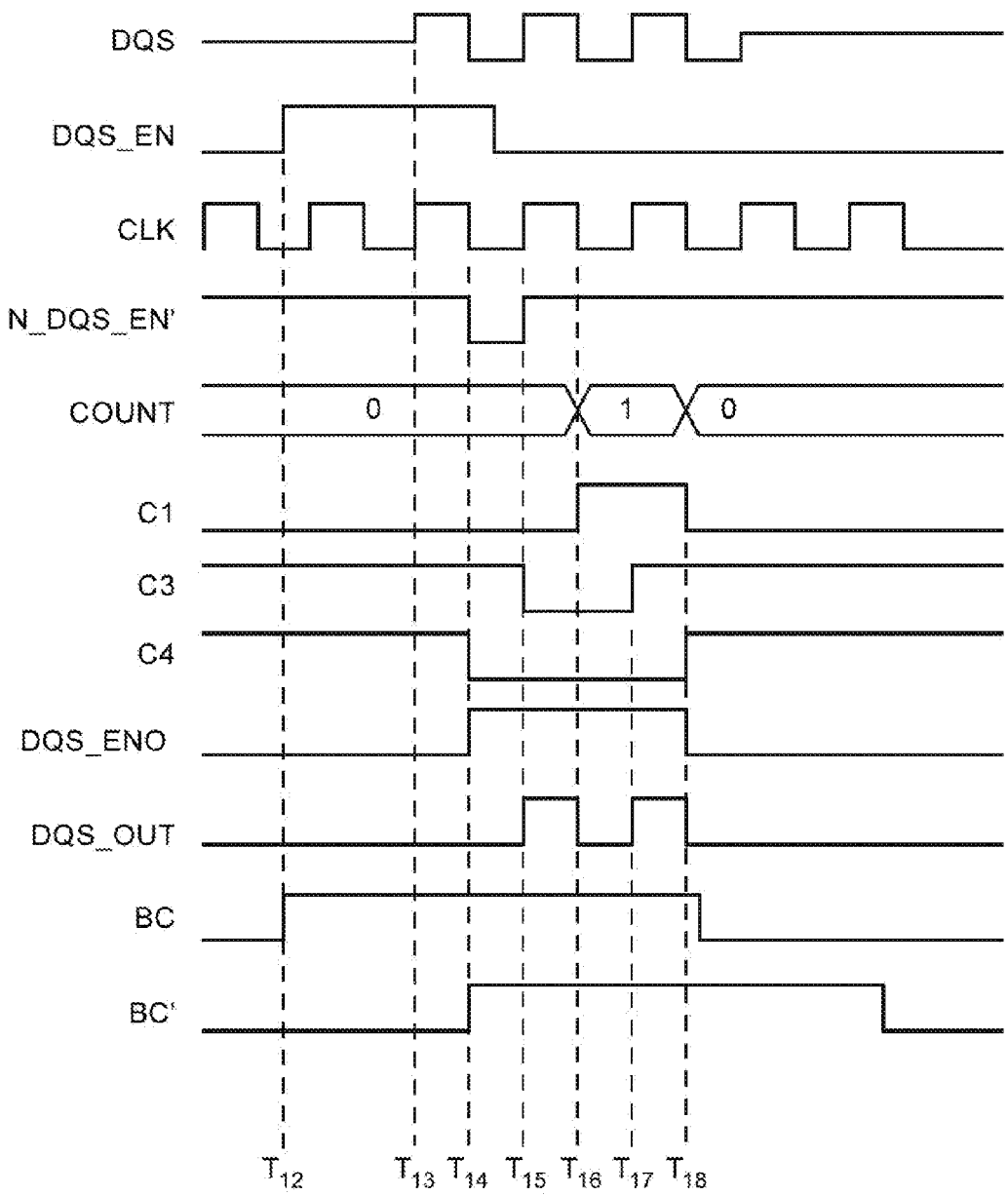
FIG. 8 is an illustrative timing diagram showing how memory interface circuitry having enable circuitry may be used to gate a data strobe signal using a data strobe enable signal and a burst chop signal received from a memory controller in accordance with an embodiment of the present invention.

FIG. 8 is an illustrative timing diagram showing how burst chop signal BC may be used for adjustment of read operation burst length. In the example of FIG. 8, memory module 22 may be configured to perform a burst read operation having burst length eight. At time T12, memory controller 28 may assert the DQS_EN signal along with burst chop signal BC in preparation for a burst read operation. Signal BC may direct counter circuitry 68 for a burst length of four instead of the previously configured burst length of eight.

At time T13, memory module 22 may initialize a DQS preamble by asserting DQS. Timing and delay circuitry 62 may activate (e.g., de-assert) N_DQS_EN' at time T14 (e.g., after DQS is de-asserted and before the end of the DQS preamble at time T15). Logic circuitry 66 may assert the DQS_ENO signal in response to the de-assertion of N_DQS_EN' at time T14, which allows the DQS signal to pass through AND gate 102 as the DQS_OUT signal. The de-assertion of the N_DQS_EN' signal may also clear flip-flop 98 so that flip-flop 98 produces signal C4 having a logic zero value at time T14 (e.g., because flip-flop 98 asynchronously clears output Q in response to a logic zero signal received at the NCLR input).

Timing and delay circuitry 62 may be configured to delay burst chop signal BC similarly to the DQS_EN signal, which helps to ensure that the relative timing between N_DQS_EN' and BC' is similar to the relative timing between DQS_EN and BC. In the example of FIG. 8, timing and delay circuitry 62 may be configured to delay the BC signal by approximately one and a half memory clock cycles to produce the BC' signal.

At time T15, DQS_OUT may be asserted. The assertion (e.g., rising edge) of DQS_OUT may also trigger flip-flop 104 to latch signal C1 and de-assert signal C2 (and signal C3) correspondingly. At the subsequent falling edge of DQS_OUT at time T16, counter circuitry 68 may increment COUNT from zero to one.

Counter circuitry 68 may assert control signal C1 when the COUNT value reaches one, because the burst chop signal BC is asserted. At the subsequent rising edge of DQS_OUT at time T17, flip-flop 104 may store asserted control signal C1, thereby asserting signal C3 via multiplexer 106. At the subsequent falling edge of DQS_OUT at time T18, signal C3 may propagate to the Q output of flip-flop 98 and signal C4 may be asserted. The assertion of signal C4 triggers the de-assertion of DQS_ENO and disables DQS_OUT (e.g., by blocking DQS). Counter circuitry 68 may also reset the COUNT value to zero at time T18.

Figure 9:
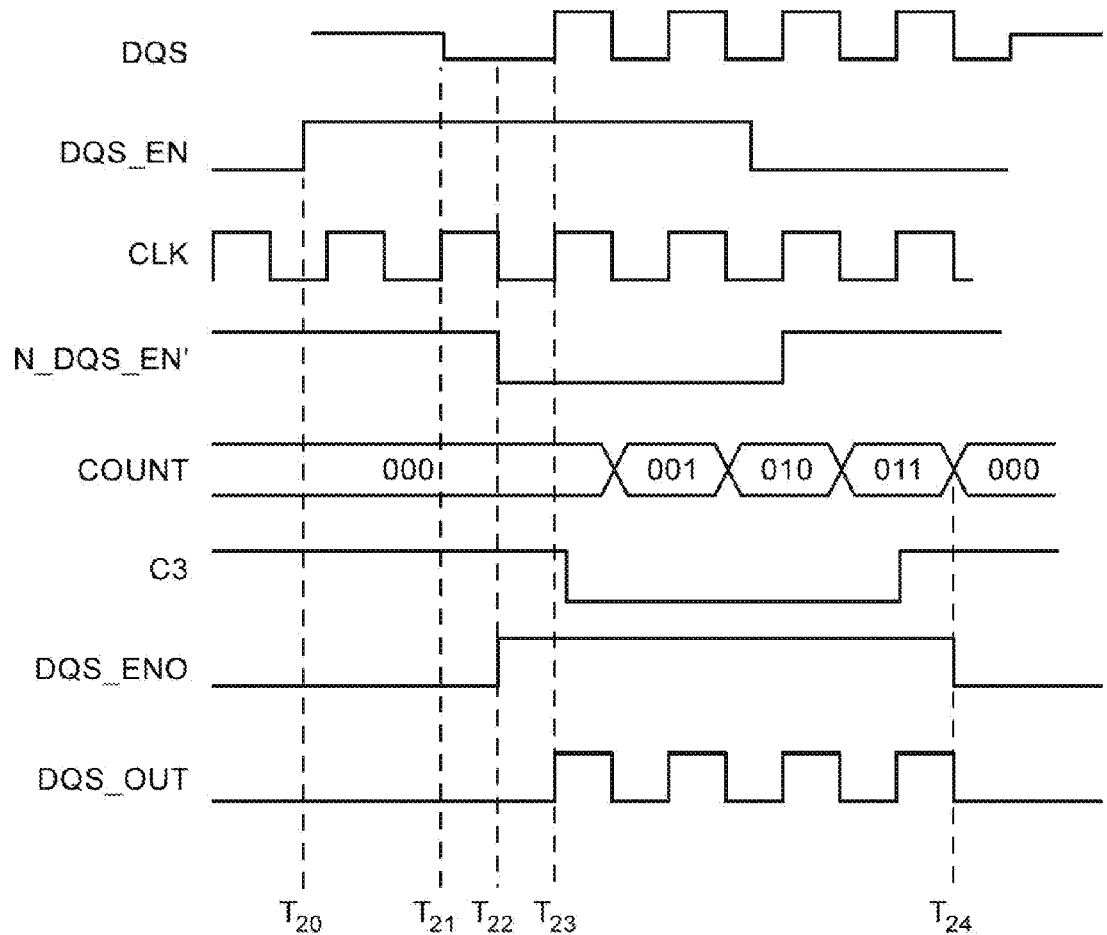
FIG. 9 is an illustrative timing diagram showing how memory interface circuitry having enable circuitry may be used to gate a data strobe signal having a preamble window in which the data strobe signal is logic zero in accordance with an embodiment of the present invention.

If desired, enable circuitry 32 may be used to provide improved timing margins for protocols having different DQS preambles. FIG. 9 is a timing diagram showing how enable circuitry 32 may process a DQS signal having a DQS preamble that is logic zero. The example of FIG. 9 may correspond to memory standards such as DDR3. In the example of FIG. 9, the DQS preamble occurs between times T21 and T23.

As shown in FIG. 9, a DQS_EN signal may be asserted by memory controller 28 at time T20. Timing and delay circuitry 62 may be configured to latch the DQS_EN signal using memory clock CLK and delay the leading edge of the DQS_EN pulse by one and a half memory clock cycles to time T22 (e.g., via programmable elements 20-1 and 20-2). At time T22, latch circuit 64 de-asserts the N_DQS_EN' (e.g., because the DQS signal is within the DQS preamble and has a value of logic zero and to follow the delayed and inverted version of DQS_EN). Counter circuitry 68 may subsequently begin counting DQS_OUT pulses until a target COUNT is reached. In the example of FIG. 9, the target COUNT may be three and counter circuitry 68 may control DQS_ENO via flip-flop 104, multiplexer 106, and flip-flop 98 to block DQS from passing to DQS_OUT at time T24.

Figure 10:
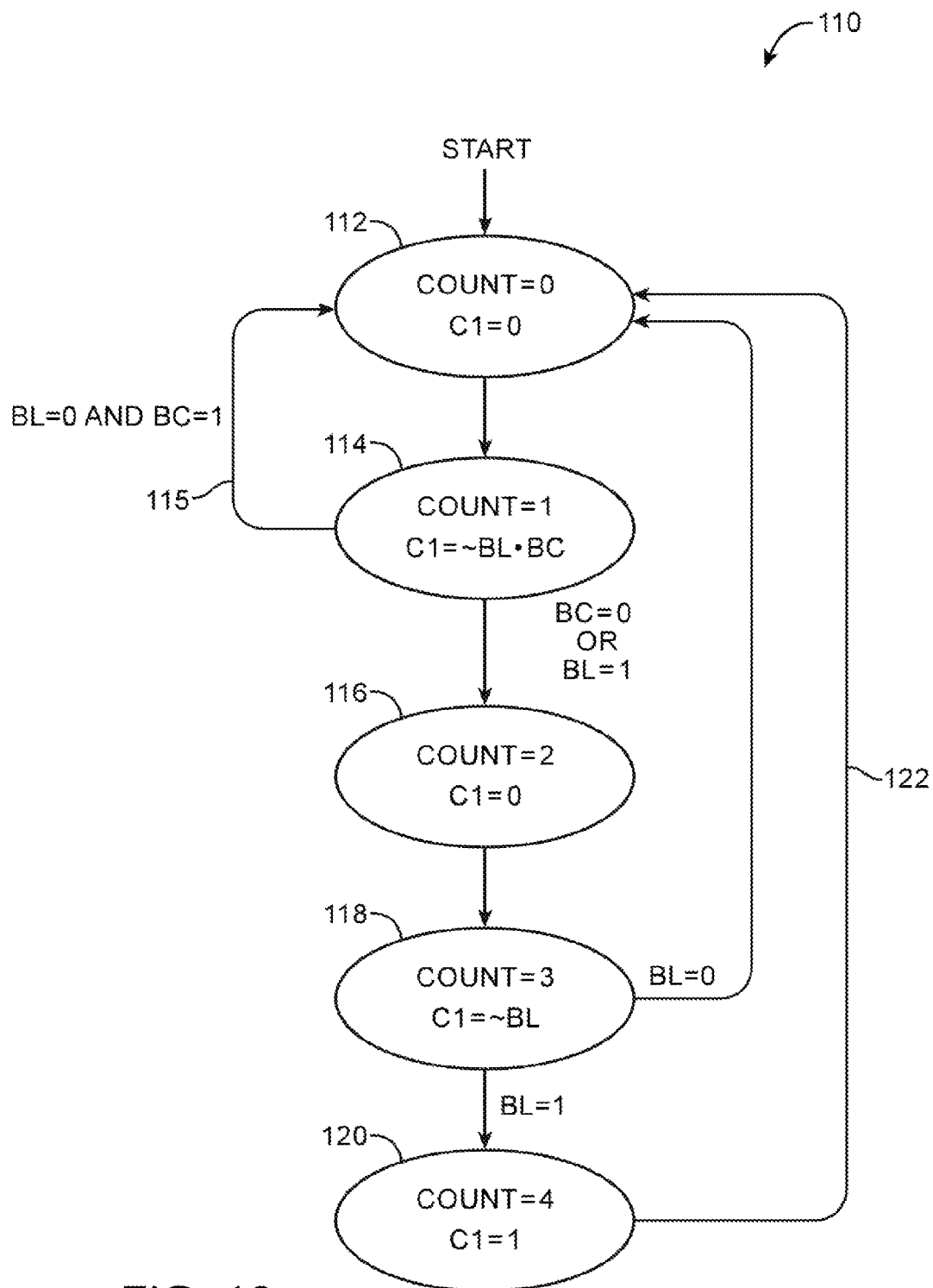
FIG. 10 is a diagram of an illustrative state machine that may be implemented using enable circuitry to control de-activation timing of a gated data strobe signal in accordance with an embodiment of the present invention.

Counter circuitry 68 may be used to implement a state machine that controls DQS gating based on a target burst length. FIG. 10 is an illustrative state machine 110 that may be implemented using logic 68. In the example of FIG. 10, burst length identifier BL provided to counter circuitry 68 (e.g., by a programmable element 20-5) may be a one-bit value that toggles state machine 110 between a burst length of eight (e.g., eight memory read transactions) and a burst length of ten (e.g., ten memory read transactions). This example is merely illustrative. If desired, burst length may be defined as any desired value using any number of control bits.

State machine 110 may be initialized to state 112, in which count is zero and counter circuitry output signal C1 is zero. Counter circuitry 68 may, for example, operate in state 112 between times T12 and T16 of FIG. 8.

State machine 110 may be clocked by an inverted version of a gated data strobe signal (e.g., an inverted DQS_OUT signal provided by inverter 108 of FIG. 5). In other words, transitions between states may be triggered by the rising edge of an inverted DQS_OUT signal (i.e., the falling edge of the DQS_OUT signal).

Counter circuitry 68 may transition from state 112 to state 114 at the falling edge of the DQS_OUT signal during state 112. For example, counter circuitry 68 may transition from state 112 to state 114 at time T16 of FIG. 8. A transition between successive states may identify that two memory read operations have occurred (e.g., because memory module 22 may be operating using a double data rate protocol in which two memory read operations occur between successive falling edges of DQS_OUT). For example, a first memory read operation may occur during the rising edge of DQS at time T15 and a second memory read operation may occur during the falling edge of DQS at time T16.

At state 114, counter circuitry output signal C1 may be asserted if burst length is eight and burst chop is activated (i.e., if BL=0 and BC=1). Assertion of output signal C1 at state 114 may allow four read operations to occur as shown in FIG. 8 before DQS is blocked by the de-assertion of DQS_ENO. If burst length is eight and burst chop is activated (i.e., if BL=0 and BC=1), counter circuitry 68 may transition from state 114 to state 112 at the next falling edge of the DQS_OUT signal during state 114. For example, counter circuitry 68 may transition to state 112 at time T18. If burst chop is not activated or burst length is ten (e.g., if BC=0 or BL=1), counter circuitry 68 may transition to state 116 at the next falling edge of the DQS_OUT signal.

At state 116, signal C1 may be de-asserted (logic zero) and counter circuitry 68 may transition to state 118 at the next falling edge of the DQS_OUT signal. At state 118, COUNT may be three and signal C1 may be asserted if burst length is eight (i.e., if BL=0), which allows eight read operations to occur as shown in FIG. 7 before DQS is blocked by the de-assertion of DQS_ENO. If burst length is eight, counter circuitry 68 may transition to state 112 at the next falling edge of the DQS_OUT signal. If burst length is ten (i.e., if BL=1), counter circuitry 68 may transition to state 120 to accommodate an additional two memory read operations.

At state 120, signal C1 may be asserted, which propagates through flip-flop 104, multiplexer 106, flip-flop 98, and NAND gate 100 to de-assert DQS_ENO and block DQS at the next falling edge of the DQS_OUT signal. Counter circuitry 68 may transition to state 112 along with the de-assertion of DQS_ENO.

Figure 11:
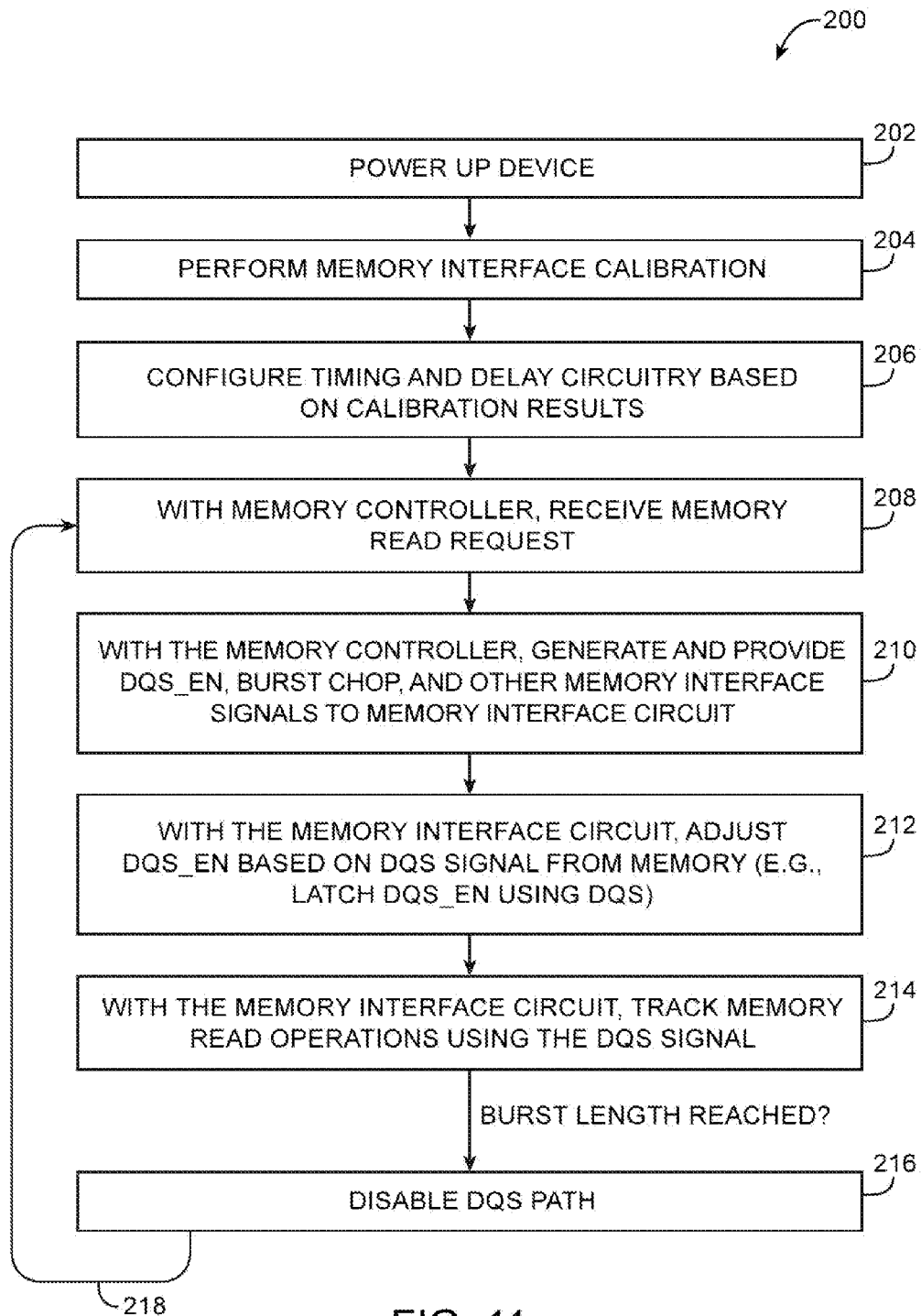
FIG. 11 is a flow chart of illustrative steps that may be performed using memory interface circuitry to gate a data strobe signal for improved timing margins in accordance with an embodiment of the present invention.

FIG. 11 is a flow chart of illustrative steps that may be performed using device 10 to gate a DQS signal received from memory module 22 during memory read operations. At initial step 202, device 10 may be powered up (e.g., turned on).

During step 204, memory interface circuitry 24 in device 10 may be calibrated. For example, calibration circuit 30 may be used to calibrate the timing of signals such as DQ, DQS, CLK, ADDR, CMD, and other interfacing signals between memory interface circuit 26 and memory module 22. Enable circuitry 32 may be calibrated to synchronize the timing of gating signals such as DQS_EN to corresponding gated signals (e.g., to synchronize DQS_EN to DQS).

During step 206, timing and delay circuitry 62 (FIG. 5) may be configured based on the calibration results of step 204. For example, adjustable delay circuit 92 may be configured to provide a desired amount of delay based on the calibration results (e.g., to help match DQS_EN to DQS). As another example, multiplexers 88-1 and 88-4 may be configured via corresponding programmable elements 20-1 and 20-2 based on the calibration results.

During step 208, memory controller 28 may receive a memory read request. For example, memory controller 28 may receive a burst memory read request from logic circuits 18 via paths 40 (FIG. 2).

During step 210, memory controller 28 may generate and provide control signals such as DQS_EN, burst chop signal BC, and other control signals to memory interface circuit 26 (e.g., signals that direct memory interface circuit 26 to perform the memory read request using memory module 22). Memory interface circuit 26 may use the control signals to generate and provide appropriate DQ, DQS, CLK, ADDR, and CMD signals to memory module 22 for performing the memory read request (e.g., via paths 34 and 36 as shown in FIG. 2).

Memory module 22 may respond to the memory read request with data and data strobe signals (e.g., DQ and DQS signals). During step 212, memory interface circuit 26 may adjust DQS_EN received from memory controller 28 based on the DQS signal from memory. For example, the DQS_EN signal may be adjusted as shown in FIG. 7 to produce a gating signal DQS_ENO that is synchronized with the DQS preamble of the DQS signal received from memory. The adjusted DQS_EN signal may be used to gate the DQS signal to help ensure that only valid DQS pulses are used.

During step 214, memory interface circuit 26 may track memory read operations using the gated DQS signal. For example, the number of pulses in the gated DQS signal may be tracked using counter circuitry 68 (FIG. 5). If memory interface circuit 26 identifies that a target read burst length has been reached, the DQS signal from memory module 22 may be blocked during step 216 (e.g., if a target count value indicating that the target read burst length has been reached, the DQS_ENO signal may be de-asserted to disable the path from DQS to DQS_OUT as shown in FIG. 5). The process may then return to step 208 via path 218 to process additional memory requests.

The foregoing is merely illustrative of the principles of this invention and various modifications can be made by those skilled in the art without departing from the scope and spirit of the invention. The foregoing embodiments may be implemented individually or in any combination.

What is claimed is:

1. Circuitry, comprising:
   latch circuitry that receives a data strobe signal and a data strobe enable signal and latches the data strobe enable signal based on the data strobe signal;
   logic circuitry that receives the data strobe signal and the latched data strobe enable signal and produces a corresponding gated data strobe signal based on the latched data strobe enable signal; and
   control circuitry that generates a control signal by monitoring the gated data strobe signal, wherein the logic circuitry receives the control signal and produces the gated data strobe signal based at least partly on the control signal.

2. The circuitry defined in claim 1, wherein the control circuitry comprises counter circuitry.

3. The circuitry defined in claim 2 wherein the counter circuitry is configured to count pulses in the gated data strobe signal to produce a counter value and wherein the counter circuitry is further configured to generate the control signal based on the counter value.

4. The circuitry defined in claim 3, wherein the counter circuitry is further configured to assert the control signal in response to identifying that the counter value has reached a target value, wherein the counter circuitry is further configured to receive a burst chop signal, and wherein the counter circuitry is further configured to adjust the target value when the burst chop signal is asserted.

5. The circuitry defined in claim 2 wherein the logic circuitry is configured to pass the data strobe signal to produce the gated data strobe signal in response to activation of the latched data strobe enable signal.

6. The circuitry defined in claim 5 wherein the logic circuitry is further configured to block the data strobe signal from passing as the gated data strobe signal in response to assertion of the control signal by the counter circuitry.

7. The circuitry defined in claim 2 wherein the latch circuitry comprises cross-coupled NAND gates that receive the data strobe enable signal and the data strobe signal and latch the data strobe enable signal in response to a de-asserted data strobe signal.

8. The circuitry defined in claim 2 further comprising:
   an inverter that receives the gated data strobe signal and inverts the gated data strobe signal, wherein the counter circuitry includes a clock input that receives the inverted gated data strobe signal.

9. The circuitry defined in claim 8 wherein the logic circuitry comprises:
   a flip-flop that receives the gated strobe signal at a flip-flop clock input, wherein the flip-flop captures the control signal based on the gated strobe signal.

10. The circuitry defined in claim 9 wherein the logic circuitry further comprises:
    an additional inverter that receives the data strobe signal and inverts the data strobe signal; and
    an additional flip-flop that receives the captured control signal and produces an intermediate control signal, wherein the additional flip-flop includes an asynchronous negative clear input that receives the latched data strobe enable signal and wherein the additional flip-flop includes an additional flip-flop clock input that receives the inverted data strobe signal.

11. The circuitry defined in claim 10 further comprising:
    a first logic gate that receives the intermediate control signal and the latched data strobe signal and produces an enable signal; and
    a second logic gate that gates the data strobe signal based on the enable signal from the first logic gate.

12. An integrated circuit operable to communicate with memory, the integrated circuit comprising:
    memory interface circuitry that receives a data strobe signal from the memory and gates the data strobe signal to produce a gated data strobe signal, wherein the memory interface circuitry monitors the gated data strobe signal to control the gating of the data strobe signal; and
    a memory controller that produces a data strobe enable signal, wherein the memory interface circuitry comprises:
      adjustable timing and delay circuitry that receives the data strobe enable signal and produces a delayed data strobe enable signal; and
      a latch circuit that receives the delayed data strobe enable signal and the data strobe signal and latches the delayed data strobe enable signal based on the data strobe signal to produce a latched enable signal, wherein the memory interface circuitry is configured to pass the data strobe signal as the gated data strobe signal in response to activation of the latched enable signal.

13. The integrated circuit defined in claim 12 wherein the memory interface circuitry further comprises:
    counter circuitry that monitors the gated data strobe signal by counting pulses in the gated data strobe signal.

14. The integrated circuit defined in claim 13 wherein the memory interface circuitry is configured to block the data strobe signal from passing as the gated data strobe signal based on how many pulses have been counted by the counter circuitry.

15. A method of operating memory interface circuitry on an integrated circuit, the method comprising:
    with the memory interface circuitry, receiving a data strobe signal from external memory;
    with the memory interface circuitry, receiving a data strobe enable signal from a memory controller;
    latching the data strobe enable signal using the data strobe signal; and
    in response to detecting activation of the latched data strobe enable signal, passing the data strobe signal to the memory controller as a gated data strobe signal based at least partly on a control value that is different than the data strobe signal and the data strobe enable signal.

16. The method defined in claim 15 wherein passing the data strobe signal to the memory controller comprises passing the data strobe signal to the memory controller when the control value has a first relationship to a predetermined threshold and preventing the data strobe signal from passing to the memory controller when the control value has a second relationship to the predetermined threshold.

17. The method defined in claim 16, wherein the control value comprises a counter value that is generated using a counter in the memory interface circuitry to count pulses of the gated data strobe signal.

18. The method defined in claim 16 further comprising:
- with the memory interface circuitry, receiving a burst chop signal from the memory controller; and
- adjusting the predetermined threshold based on the burst chop signal.

\* \* \* \* \*